(12) United States Patent
Trifonov

(10) Patent No.: US 7,518,440 B1
(45) Date of Patent: Apr. 14, 2009

(54) DUAL PATH CHOPPER STABILIZED AMPLIFIER AND METHOD

(75) Inventor: Dimitar T. Trifonov, Vail, AZ (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/986,762

(22) Filed: Nov. 26, 2007

(51) Int. Cl.
*H03F 1/02* (2006.01)

(52) U.S. Cl. .......................... 330/9; 327/124
(58) Field of Classification Search .......... 330/9; 327/124, 307
See application file for complete search history.

(56) References Cited

U.S. PATENT DOCUMENTS

| 7,262,654 | B2* | 8/2007 | Kejariwal et al. | 330/9 |
| 7,292,095 | B2* | 11/2007 | Burt et al. | 330/9 |
| 7,446,602 | B2* | 11/2008 | Yoshikawa | 330/9 |
| 7,456,684 | B2* | 11/2008 | Fang et al. | 330/9 |

OTHER PUBLICATIONS

U.S. Appl. No. 11/340,223, filed Jan. 26, 2006.

* cited by examiner

*Primary Examiner*—Henry K Choe
(74) *Attorney, Agent, or Firm*—John J. Patti; Wade J. Brady, III; Frederick J. Telecky, Jr.

(57) ABSTRACT

A dual path chopper-stabilized amplifier (100) includes first (11) and second (11A) chopping/notch-filtering paths, each including an input chopper (9,9A), a transconductance amplifier (2,2A), and a notch filter (15,15A). Chopping and notch filtering in the first path are controlled by first (CHOPCLK) and second (FILTERCLK) clock signals, respectively. Chopping and notch filtering in the second path are controlled by the second (FILTERCLK) and first (CHOPCLK) clock signals, respectively. Outputs of the first (15) and second (15A) switched capacitor notch filters are combined to provide an amplifier output signal (23A,B) that updates a capacitance (C4) at 4 times the frequency of the filter clock signal, to thereby improve amplifier stability without increasing clock frequency.

20 Claims, 5 Drawing Sheets

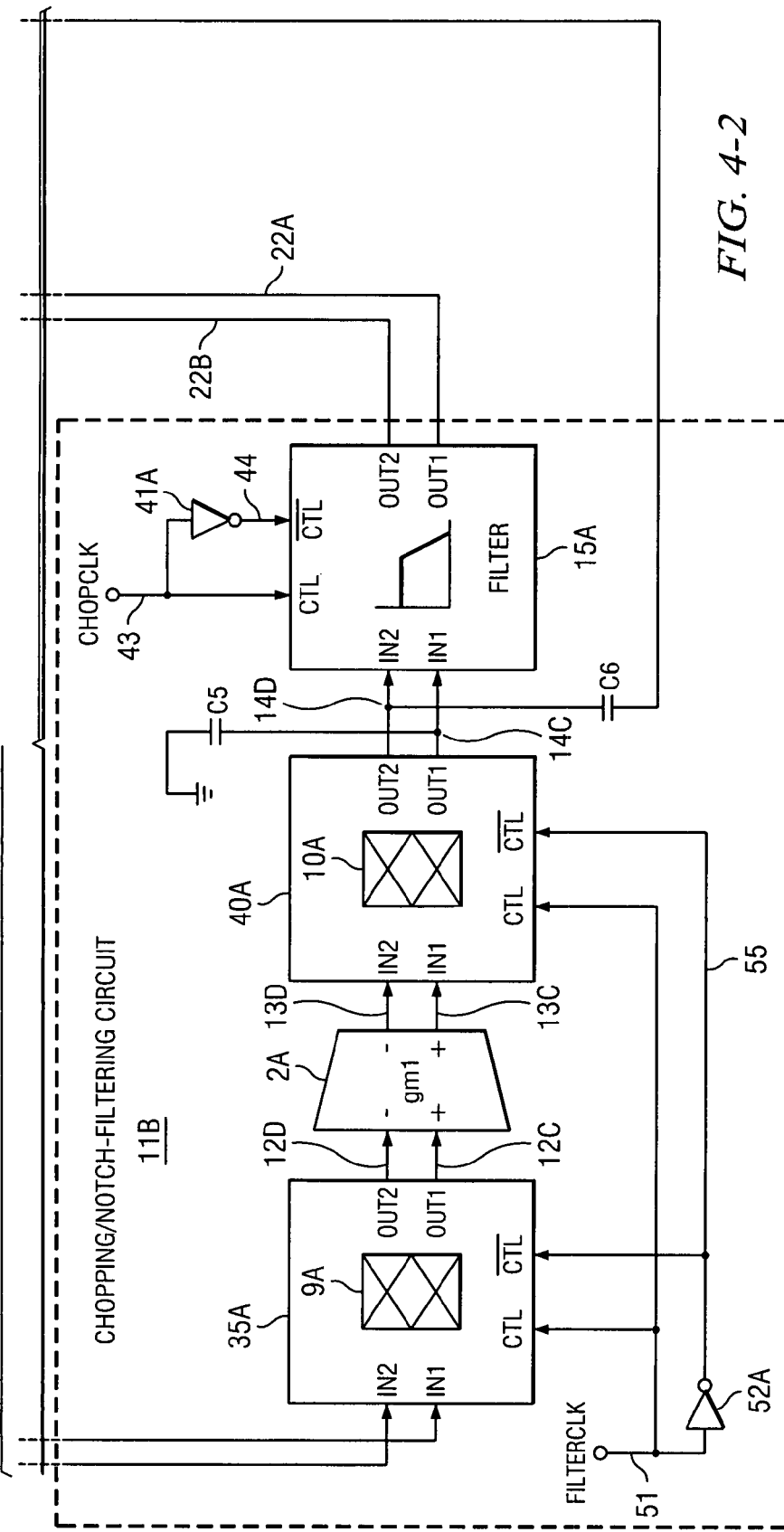

DUAL PATH CHOPPER STABILIZED AMPLIFIER AND METHOD

BACKGROUND OF THE INVENTION

The present invention relates generally to chopper stabilized amplifiers that include notch filters to reduce output voltage ripple, and more particularly to circuitry and methods that provide improved stability at high amplifier bandwidth.

The prior art is believed to include the commonly assigned pending patent application Ser. No. 11/340,223 filed Jan. 26, 2006, entitled "Notch Filter for Ripple Reduction and Chopper Stabilized Amplifiers" by Rodney T. Burt and Joy Y. Zhang, and incorporated herein by reference.

It is highly desirable that integrated circuit operational amplifiers have low offset voltage, low noise, low offset voltage drift, and good signal stability. Chopper stabilization and auto-zeroing are two common techniques that have been widely used to reduce amplifier offset thereof voltage and drift. Modern chopper-stabilized operational amplifiers and autozero operational amplifiers have significantly reduced, or even essentially eliminated, the amount switching noise therein compared to previous designs. However, the improved design techniques used in modern chopper-stabilized operational amplifiers and auto-zero operational amplifiers result in trade-offs between input referred noise and quiescent supply current (Iq). The auto-zeroing method provides low ripple noise at the amplifier output, and the in-band noise is high due to aliasing or noise folding. On the other hand, the chopper stabilization presents lower in-band noise due to absence of noise folding, but its output ripple noise is higher. Basic chopper-stabilized amplifiers maintain the broadband noise characteristics of their input stages, but "shift" their input offset voltages up to the chopping frequency, creating large ripple voltages at the amplifier outputs.

Above mentioned Ser. No. 11/340,223 provides a solution to the foregoing trade-offs. Referring to Prior Art FIG. 1, which is a copy of FIG. 3A of Ser. No. 11/340,223, shows a operational amplifier 1 which receives an input signal Vin that is applied to input chopping circuitry 9. Input chopping circuitry 9 includes switches 9-1 and 9-2 connected to (−) input conductor 7A and switches 9-3 and 9-4 connected to (+) input conductor 7B. Switches 9-1 and 9-3 are connected by conductor 12A to the (+) input of operational transconductance amplifier 2, and switches 9-2 and 9-4 are connected by conductor 12B to the (−) input of operational transconductance amplifier 2. Output conductors 13A and 13B of operational transconductance amplifier 2 are connected to output chopping circuitry 10, which includes switches 10-1 and 10-2 connected to conductor 13A and switches 10-3 and 10-4 connected to conductor 13B. Chopper switches 10-1 and 10-3 are connected to conductor 14A, and chopper switches 10-2 and 10-4 are connected to conductor 14B. The chopped output of operational transconductance amplifier 2 produced between conductors 14A and 14B is applied to the differential inputs of a switched capacitor notch filter 15. Conductor 14B is also connected to one terminal of a capacitor C3b, the other terminal of which is connected to ground. Conductor 14A also is connected to one terminal of a compensation capacitor C2b, the other terminal of which is connected to Vout conductor 25.

Switched capacitor notch filter 15 (which is a low pass filter with notches at the chopping frequency fs and its harmonics) includes switch 16A connected between conductors 14A and 17, switch 16B connected between conductors 14B and 18, switch 16C connected between conductors 14A and 19, and switch 16D connected between conductors 14B and 20. An "integrate and transfer" capacitor C5 is connected between conductors 17 and 18, and another "integrate and transfer" capacitor C6 is connected between conductors 19 and 20. Switched capacitor notch filter 15 also includes switch 21A connected between conductors 17 and 22A, switch 21B connected between conductors 19 and 22A, switch 21C connected between conductors 18 and 22B, and switch 21D connected between conductors 20 and 22B. Capacitor C4 is connected between output conductors 22A and 22B of notch filter 15. The (+) input conductor 7B of operational amplifier 1 is connected to the (−) input of operational transconductance amplifier 5, the (+) input of which is connected to the (−) input conductor 7A of operational amplifier 1. The output of a feed-forward operational transconductance amplifier 5 is connected by conductor 23 to the (−) input of operational amplifier 4, which alternatively can be a transconductance operational amplifier.

Notch filter 15 includes two parallel signal paths, each with switches operating at the same frequency fs as the chopping signals shown in FIG. 2A but with a ¼ period delay. The ¼ period delays allow integrating of the amplified signal and the offset of input operational transconductance amplifier 2 in half the cycle of the chopping frequency. However, it should be noted that the switching frequency of notch filter 15 can be different than the chopping frequency fs. For example, the switching frequency of notch filter 15 can be one half of the chopping frequency fs, with no delay, in which case the amplified signal and the offset and ripple components therein are integrated over an entire chopping frequency cycle, as shown in FIG. 2B.

Notch filter output conductor 22A is connected to the (+) input of operational transconductance amplifier 3 and to one terminal of a compensation capacitor C2a, the other terminal of which is connected to output conductor 25. Notch filter output conductor 22B is connected to the (−) input of operational transconductance amplifier 3 and to one terminal of a capacitor C3a, the other terminal of which is connected to ground. The output of operational transconductance amplifier 3 is connected by conductor 23 to the (−) input of transconductance operational amplifier or operational amplifier 4 (hereinafter referred to as operational amplifier 4), the output of which is connected to output conductor 25 and the (+) input of which is connected to ground. Conductor 23 also is connected to one terminal of compensation capacitor C1, the other terminal of which is connected to output conductor 25.

The two timing diagrams shown in FIG. 2A and FIG. 2B, respectively, each illustrate four synchronized clock signals Phase1, Phase2, Phase3, and Phase4 which can be used to control the various chopping switches and filter switches as shown in FIG. 1. Phase1 controls chopping switches 9-1, 9-4, 10-1, and 10-4, and Phase2 controls chopping switches 9-2, 9-3, 10-2, and 10-3. Phase3 controls notch filter switches 16A, 16B, 21B, and 21D, and Phase4 controls switches 16C, 16D, 21A and 21C. The Phase1 and Phase2 chopping signals are the same in FIGS. 2A and 2B. In FIG. 2A the Phase3 and Phase4 notch filter clocking signals operate at the same frequency fs as the chopping signals Phase1 and Phase2 but are 90 degrees out of phase with them. However, in FIG. 2B the Phase3 and Phase4 notch filter clocking signals operate at half the chopping frequency, i.e. at fs/2, as the chopping signals Phase1 and Phase2 but in phase with them.

Note that in the subsequently described drawings, Phase1 is also referred to as CHOPCLK, Phase2 is also referred to as $\overline{\text{CHOPCLK}}$, Phase3 is referred to as FILTERCLK, and Phase4 is also referred to as $\overline{\text{FILTERCLK}}$, so both names for each waveform are indicated in FIG. 2A.

In notch filter input conductors 14A and 14B there are currents from transconductance stage 2, and the net current through conductors 14A and 14B is integrated during one of Phase1 and Phase2 onto integrate and transfer capacitor C5, and during the other phase the net current is integrated onto the other integrate and transfer capacitor C6. This results in all of the signal charge being available on integrate and transfer capacitors C5 and C6, and all of the signal charge is available for redistribution to the next stage, i.e. to the capacitance coupled to notch filter output conductors 22A and 22B. This is advantageous because any loss of signal charge may result in loss of signal information and hence reduced signal-to-noise ratio, and also tends to produce offset voltages and aliasing of noise.

More specifically, in the operation of notch filter 15 one signal path integrates the amplified and chopped signal (including the ripple current resulting from the offset voltage) from operational transconductance amplifier 2 on the integrate and transfer capacitor C5 during one half of the notch filter switching cycle. During the same interval the other signal path "transfers" the amplified signal (including the ripple current resulting from the offset voltage) from integrate and transfer capacitor C6 to operational transconductance amplifier 3. During the next half cycle of operation of notch filter 15, the integrate and transfer functions of the two signal paths are reversed. The frequency response of notch filter 15 includes notches at the chopping frequency spectrum values of fs and its harmonics, so the notches suppress the ripple voltages that usually occur in a conventional chopper-stabilized amplifier.

Chopper stabilized operational amplifier 1 of Prior Art FIG. 1 uses a switched capacitor notch filter with synchronous integration in a continuous time signal path to reduce chopping noise well below the total rms noise of the operational amplifier. The operational amplifier maintains the benefits of chopper stabilization while attenuating the ripple voltage at the chopping frequency fs.

Prior Art FIG. 3 shows a somewhat simplified block diagram representation 1A of the same circuit shown in FIG. 1 having a chopping stage, notch filter and feed forward stage. Transconductance stage 5 is shown having a differential output between conductors 23A and 23B. Block 35 contains the input chopping switches 9, which are the same as switches 9-1,2,3,4 as shown in FIG. 1, and similarly block 40 contains the output chopping switches 10, which are the same as switches 10-1,2,3,4 as shown in FIG. 1. The chopping clock signal CHOPCLK on conductor 43 is applied to the control (CTL) inputs (not shown) of various input chopping switches 9 and various output chopping switches 10 and also is applied to the input of an inverter 41 which produces the logical complement of CHOPCLK and applies it to the $\overline{CTL}$ inputs (not shown) of various input chopping switches 9 and the various output chopping switches 10. CHOPCLK can be the same as Phase1 in FIG. 2A, and the logical complement of CHOPCLK can be the same as Phase2 in FIG. 2A. The input chopping switches 9 and output chopping switches 10 typically are implemented by means of CMOS transmission gates. Similarly, filter clock signal FILTERCLK on conductor 51 is applied to the CTL inputs (not shown) of various switches 16 and 21 in notch filter 15 and also is applied to the input of an inverter 52 which produces the logical complement of FILTERCLK and applies it to the $\overline{CTL}$ inputs (not shown) of various switches 16 and 21 in notch filter 15. FILTERCLK can be the same as Phase3 in FIG. 2A, and the logical complement of FILTERCLK can be the same as Phase4 in FIG. 2A. Transconductance stages 3 and 4 in block 3,4 of Prior Art FIG. 1 are combined in the same manner in block 3,4 in FIG. 3, wherein the two inputs IN1(+) and IN1(−) are the inputs of the gm3 transconductance stage and the two inputs IN2(+) and IN2(−) are the inputs of the gm2 transconductance stage in FIG. 3.

The prior art chopper stabilized amplifier in FIGS. 1 and 3 provides the advantages of both low in-band noise and the absence of noise folding. Notch filter 15 greatly reduces the ripple and preserves the low offset, low drift and low noise of the basic chopper stabilized amplifier topology, but unfortunately also creates a delay associated with the transfer function of the chopped signal path. This notch filter delay creates stability problems that increase as the amplifier bandwidth increases. The delay and stability problems also have an undesirable effect on output noise of the chopper stabilized amplifier at high frequency. One way to improve the amplifier stability is to increase the chopping frequency. This solves the above mentioned stability problem, but then the increased frequency does not allow sufficient time to fully recharge the parasitic capacitances on output conductors 13A and 13B of transconductance stage 2. This reduces the effective gain of the circuitry including input chopper 9, transconductance stage 2, and output chopper 10 of chopper stabilized amplifier 1A, and accordingly degrades its offset voltage and drift thereof. The charge injection from the switches and the non-ideal 50% duty cycle of the clock signal sources contribute to increasing the amplifiers offset and drift as the chopping frequency increases.

To summarize, notch filter 15 creates a delay in the signal path. During a time interval equal to one half of the delay in notch filter 15, integrate and transfer capacitor C5 in FIG. 1 is connected to the output of transconductance stage gm1 and integrate and transfer capacitor C6 is connected to the input of transconductance stage gm2. During that time interval the present input voltage $Vin^+ - Vin^-$ applied between the input conductors 7A and 7B causes a corresponding effect voltage on capacitor C5, but capacitor C5 is not connected to the input of transconductance stage gm2. There is a delay time interval during which there is no connection between transconductance stages gm1 and gm2. Later, after the roles of integrate and transfer capacitors C5 and C6 have been reversed, C5 is coupled to the (+) input of transconductance stage gm2, and only then is the corresponding effect voltage transferred from transconductance stage gm1 to Vout. The notch filter delay, which is a constant phase delay in the signal path, creates a stability problem for the chopper stabilized amplifier of FIGS. 1 and 3. The foregoing phase delay decreases the phase margin and hence decreases the stability of the chopper stabilized amplifier of FIGS. 1 and 3. Increasing the chopping frequency (which might not even be a viable option) would reduce the notch filter delay and would cause several problems. One problem is that transconductance stage gm1 would become less able to reduce the input-referred offset of transconductance stage gm4 because during every cycle transconductance stage gm1 must recharge parasitic capacitances on its output. That results in reduction of the offset and offset drift of the chopper stabilized amplifier and also increases its input bias current.

Thus, there is an unmet need for an economical, low ripple chopper stabilized amplifier and method which avoid the increased noise, reduced gain, increased offset, and increased offset drift that occur if the chopping frequency is increased to improve the stability in the prior art chopper stabilized amplifiers which include a notch filter.

There also is an unmet need for an economical, low ripple chopper stabilized amplifier and method which avoid the increase in input bias current that occurs if the chopping frequency is increased to improve the stability in the prior art chopper stabilized amplifiers which include a notch filter.

There also is an unmet need for an economical, low ripple chopper stabilized amplifier and method which provide higher amplifier bandwidth while preserving low offset and drift, without increasing the chopping frequency.

There also is an unmet need for an economical, low ripple chopper stabilized amplifier and method which is usable in applications that do not allow use of increased chopping frequency because of system constraints.

SUMMARY OF THE INVENTION

It is an object of the invention to provide an economical, low ripple chopper stabilized amplifier and method which avoid performance problems that occur if the chopping frequency is increased to improve the stability in the prior art chopper stabilized amplifiers which include a notch filter.

It is another object of the present invention to provide an economical, low ripple chopper stabilized amplifier and method which avoid the increased noise, reduced gain, increased offset, and increased offset drift that occur if the chopping frequency is increased to improve the stability in the prior art chopper stabilized amplifiers which include a notch filter.

It is an object of the invention to provide an economical, low ripple chopper stabilized amplifier and method which avoid increased input bias current that occurs if the chopping frequency is increased to improve the stability in the prior art chopper stabilized amplifiers which include a notch filter.

It is another object of the invention to provide an economical, low ripple chopper stabilized amplifier and method which provide higher amplifier bandwidth while preserving low offset and drift, without increasing the chopping frequency.

It is another object of the invention to provide an economical, low ripple chopper stabilized amplifier and method which is usable in applications that do not allow use of increased chopping frequency because of system constraints.

Briefly described, and in accordance with one embodiment, the present invention provides a dual path chopper-stabilized amplifier (100) includes first (11) and second (11A) chopping/notch-filtering paths, each including an input chopper (9,9A), a transconductance amplifier (2,2A), and a notch filter (15,15A). Chopping and notch filtering in the first path are controlled by first (CHOPCLK) and second (FILTERCLK) clock signals, respectively. Chopping and notch filtering in the second path are controlled by the second (FILTERCLK) and first (CHOPCLK) clock signals, respectively. Outputs of the first (15) and second (15A) switched capacitor notch filters are combined to provide an amplifier output signal (23A,B) that updates a capacitance (C4) at 4 times the frequency of the filter clock signal, to thereby improve amplifier stability without increasing clock frequency.

In one embodiment, the invention provides a chopper-stabilized amplifier (100) having a first chopping/notch-filtering circuit (11A) including a first amplifier (2), first input chopper circuitry (9) coupled to an input (12A,B) of the first amplifier (2) for chopping an input signal (Vin$^+$-Vin$^-$) and applying the chopped input signal to the input (12A,B) of the first amplifier (2). First output chopper circuitry (10) is coupled to an output (13A,B) of the first amplifier (2) for chopping an output signal produced by the first amplifier (2). The first input chopper circuitry (9) and the first output chopper circuitry (10) are clocked by a first clock signal (CHOPCLK/Phase1). A first switched capacitor notch filter (15) has an input (14A,B) coupled to an output of the first output chopper circuitry (10) and performs an integrate and transfer function on a chopped output signal produced by the first output chopper circuitry (10) to filter a chopped output signal produced by the first output chopper circuitry (10) by operating synchronously with a chopping frequency of the first clock signal (CHOPCLK/Phase1) to notch-filter noise signals on the chopped output signal of the first output chopper circuitry (10) that otherwise would cause output ripple voltages on an output of the first switched capacitor notch filter (15). The first switched capacitor notch filter (15) is clocked by a second clock signal (FILTERCLK). A second chopping/notch-filtering circuit (11B) includes a second amplifier (2A). Second input chopper circuitry (9A) is coupled to an input (12C,D) of the second amplifier (2A) for chopping the input signal (Vin$^+$-Vin$^-$) and applying that chopped input signal to the input (12C,D) of the second amplifier (2A). Second output chopper circuitry (10A) is coupled to an output (13C,D) of the second amplifier (2A) for chopping an output signal produced by the second amplifier (2A). The second input chopper circuitry (9A) and the second output chopper circuitry (10A) are clocked by a third clock signal (e.g., FILTERCLK or other filter clock). A second switched capacitor notch filter (15A) has an input (14C,D) coupled to an output of the second output chopper circuitry (10A) and performs an integrate and transfer function on a chopped output signal produced by the second chopper circuitry (10A) to filter a chopped output signal produced by the second output chopper circuitry (10A) by operating synchronously with a chopping frequency of the third clock signal (e.g., FILTERCLK or other filter clock) to notch-filter noise signals on the chopped output signal of the second output chopper circuitry (10A) that otherwise would cause output ripple voltages on an output of the second switched capacitor notch filter (15A). The second switched capacitor notch filter (15A) is clocked by a fourth clock signal (e.g., CHOPCLK or other chopping clock). The outputs (22A,B) of the first (15) and second (15A) switched capacitor notch filters are coupled together so as to provide a combined output signal (23A,B) that updates a load (C4) coupled to the outputs of the first (15) and second (15A) switched capacitor filters at a frequency that is 4 times the frequency of the second clock signal (FILTERCLK).

In the described embodiment, the third clock signal is the same as the second clock signal (FILTERCLK/Phase3) and a fourth clock signal is the same as the first clock signal (CHOPCLK/Phase1).

In the described embodiment, a third transconductance amplifier (gm2 in block 3,4) has an input coupled to the outputs (22A,22B) of both of the first (15) and second (15A) switched capacitor notch filters.

In one embodiment, transitions of the second (Phase3/FILTERCLK) and fourth (Phase4/$\overline{\text{FILTERCLK}}$) clock signals are shifted with respect to transitions of the first clock signal (Phase1/CHOPCLK). In one embodiment, transitions of the second (Phase3/FILTERCLK) and fourth (Phase4/$\overline{\text{FILTERCLK}}$) clock signals are shifted by 90 degrees with respect to transitions of a chopping signal of the first clock signal (Phase1/CHOPCLK).

In one embodiment, a third transconductance amplifier (gm2 in block 3,4) has an input coupled to an output (22A,B) of the first (15) and second (15A) switch capacitor notch filters, and a fourth transconductance amplifier (5) has an input coupled to receive the input signal (Vin$^+$-Vin$^-$) and an output (23A,B) coupled to an input of a fifth transconductance amplifier (gm2 in block 3,4).

In one embodiment, the invention provides a method of operating a chopper-stabilized amplifier (100) including performing a chopping/amplifying/notch-filtering operation on an input signal (Vin$^+$-Vin$^-$) in a first chopping/notch-filtering path (11A) by chopping the input signal (Vin⁺-Vin⁻) in response to a first clock signal (CHOPCLK), applying the chopped input signal to the input of a first transconductance amplifier (2), and chopping an output signal produced by the first transconductance amplifier (2) in response to the first clock signal (CHOPCLK) to produce a first chopped output signal (14A,B), and operating a first switched capacitor notch filter (15) having an input coupled to receive the first chopped output signal (14A,B) by performing an integrate and transfer function on the first chopped output signal (14A,B) synchronously with the first clock signal (CHOPCLK) to notch-filter noise signals in the first chopped output signal (14A,B) that otherwise would cause output ripple voltages of the chopper-stabilized amplifier (100). The method also includes performing a chopping/amplifying/notch-filtering operation on the input signal (Vin⁺-Vin⁻) in a second chopping/notch-filtering path (11B) by chopping the input signal (Vin⁺-Vin⁻) in response to a second clock signal (e.g., FILTERCLK or other chopping clock), applying the chopped input signal to the input of a second transconductance amplifier (2A), and chopping an output signal produced by the second transconductance amplifier (2A) in response to the second clock signal (e.g., FILTERCLK or other chopping clock) to produce a second chopped output signal (14C,D), and operating a second switched capacitor notch filter (15A) having an input coupled to receive the second chopped output signal (14C,D) by performing an integrate and transfer function on the second chopped output signal (14C,D) synchronously with the second clock signal (e.g., FILTERCLK or other chopping clock) to notch-filter noise signals in the second chopped output signal (14C,D) that otherwise would cause output ripple voltages of the chopper-stabilized amplifier (100). Outputs (22A,B) of the first (15) and second (15A) switched capacitor notch filters are combined to provide a combined output signal (23A,B) that updates a load (C4) coupled to the outputs of the first (15) and second (15A) switched capacitor notch filters at a frequency that is 4 times a frequency (e.g., the frequency of FILTERCLK) at which the first (15) and second (15A) notch filters are clocked.

In one embodiment, the invention provides the chopper-stabilized amplifier (100) including means (11A) for performing a chopping/amplifying/notch-filtering operation on an input signal (Vin⁺-Vin⁻) in a first chopping/notch-filtering path which includes means (9) for chopping the input signal (Vin⁺-Vin⁻) in response to a first clock signal (CHOPCLK) and applying the chopped input signal to the input of a first transconductance amplifier (2), and means (10) for chopping an output signal produced by the first transconductance amplifier (2) in response to the first clock signal (CHOPCLK) to produce a first chopped output signal (14A,B), and means (15,41) for operating a first switched capacitor notch filter (15) having an input coupled to receive the first chopped output signal (14A,B) by performing an integrate and transfer function on the first chopped output signal (14A,B) synchronously with the first clock signal (CHOPCLK) to notch-filter noise signals in the first chopped output signal (14A,B) that otherwise would cause output ripple voltages of the chopper-stabilized amplifier (100). The chopper stabilized amplifier 100 also includes means (11B) for performing a chopping/amplifying/notch-filtering operation on the input signal (Vin⁺-Vin⁻) in a second chopping/notch-filtering path, which includes means (9A) for chopping the input signal (Vin⁺-Vin⁻) in response to a second clock signal (e.g., FILTERCLK or other chopping clock) and applying the chopped input signal to the input of a second transconductance amplifier (2A), and means (10A) for chopping an output signal produced by the second transconductance amplifier (2A) in response to the second clock signal (e.g., FILTERCLK or other chopping clock) to produce a second chopped output signal (14C,D), and means (15A,52A) for operating a second switched capacitor notch filter (ISA) having an input coupled to receive the second chopped output signal (14C,D) by performing an integrate and transfer function on the second chopped output signal (14C,D) synchronously with the second clock signal (e.g., FILTERCLK or other chopping clock) to notch-filter noise signals in the second chopped output signal (14C,D) that otherwise would cause output ripple voltages of the chopper-stabilized amplifier (100). The chopper stabilized amplifier also includes means (22A,22B) for combining outputs of the first (15) and second (15A) switched capacitor notch filters to provide a combined output signal (23A,B) that updates a capacitance (C4) coupled to the outputs of the first (15) and second (ISA) switched capacitor notch filters at a frequency that is 4 times a frequency (e.g., the frequency of FILTERCLK) at which the first (15) and second (15A) notch filters are clocked.

DETAILED DESCRIPTION OF THE PREFERRED EMBODIMENTS

The present invention provides a dual path chopper stabilized amplifier (or one having more than dual paths) that provides improved stability and at the same time preserves the good offset, drift, and low input bias current associated with chopper stabilized amplifier performance. For example, an additional chopping stage and an additional notch filter are added in parallel with the main chopping stage 9,10 and notch filter 15 in Prior Art FIG. 3.

Figure 3:
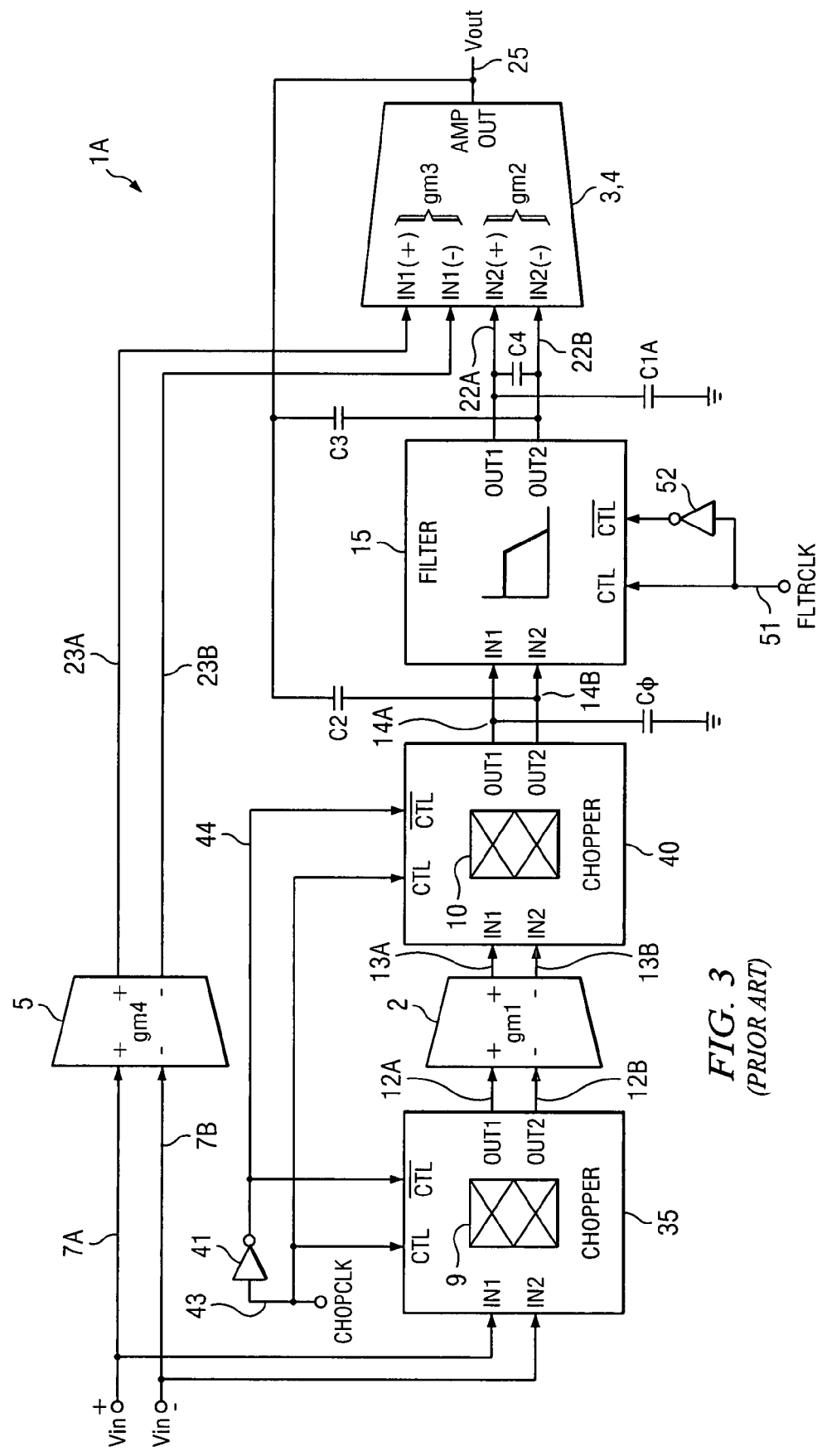
FIG. 3 is a schematic diagram of a basic prior art chopper stabilized amplifier including a switched capacitor notch filter with synchronous integration.
Figures 1, 4:
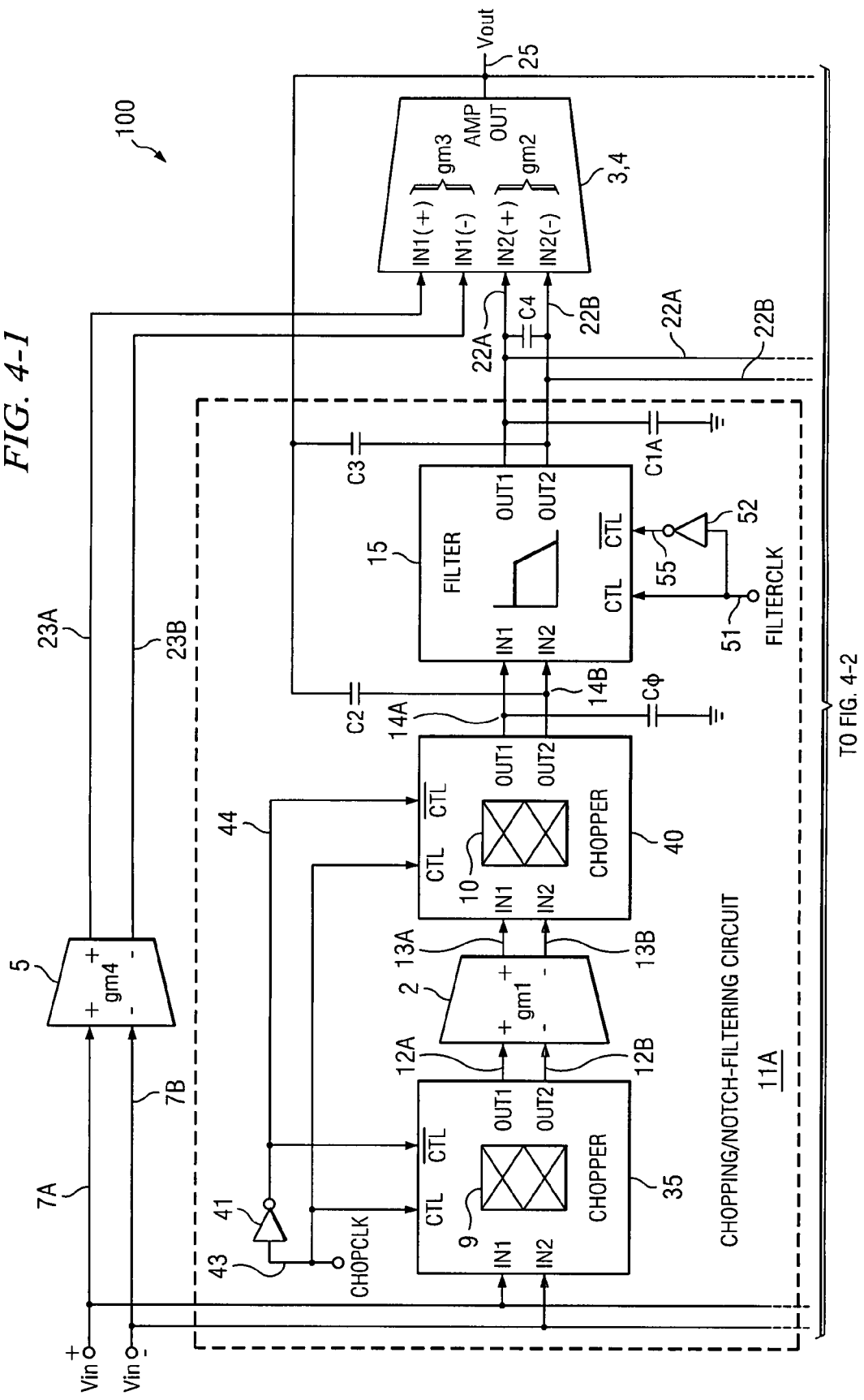
FIG. 4 is a schematic diagram of a dual path chopper stabilized amplifier according to the present invention.

Referring to FIG. 4, dual path chopper stabilized amplifier 100 includes the structure shown in Prior Art FIG. 3, which includes a first chopping/notch-filtering circuit 11A. The dual path chopper stabilized amplifier 100 further includes a second chopping/notch-filtering circuit 11B. Specifically, the first chopping/notch-filtering signal path 11A includes a first input chopping circuit 35, a first differential transconductance amplifier 2, a first output chopping circuit 40, and a first notch filter 15. The second chopping/notch-filtering signal path 11B includes a second input chopping circuit 35A, a second differential transconductance amplifier 2A, a second output chopping circuit 40A, and a second switched capacitor notch filter 15A. An input signal Vin⁺ is applied by means of conductor 7A to the (+) input of a differential feed forward transconductance amplifier 5, the IN1 input of input chopping circuit 35, and the IN1 input of input chopping circuit 35A. An input signal Vin⁻ is applied by means of conductor 7B to the (−) input of differential feed forward transconductance amplifier 5, the IN2 input of input chopping circuit 35, and the IN2 input of input chopping circuit 35A.

In the above mentioned first chopping/notch-filtering circuit 11A, the first output OUT1 of input chopping circuit 35 is connected by means of conductor 12A to the (+) input of transconductance amplifier 2, which has transconductance gm1, the (+) output of which is connected by conductor 13A to the IN1 input of output chopping circuit 40. The output OUT2 of input chopping circuit 35 is connected by means of conductor 12B to the (−) input of transconductance amplifier 2, the (−) output of which is connected by conductor 13B to the IN2 input of output chopping circuit 40. The output OUT1 of output chopping circuit 40 is connected by conductor 14A to the IN1 input of notch filter 15 and to one terminal of a capacitor C0, the other terminal of which is connected to ground. The output OUT2 of output chopping circuit 40 is connected by conductor 14B to the IN2 input of notch filter and to one terminal of a capacitor C2, the other terminal of which is connected to the output conductor 25 on which the output signal Vout of dual path chopper stabilized amplifier 100 is produced. Output conductor 25 is connected to the output of the circuitry in block 3,4, the contents of which are shown in detail in Prior Art FIG. 1. Specifically, the output of transconductance amplifier 4 in block 3,4 of Prior Art FIG. 1, also referred to as transconductance amplifier gm3, is connected to Vout conductor 25. The (−) input of transconductance amplifier gm3 is connected by conductor 23 in Prior Art FIG. 1 to the output of transconductance amplifier 5, to the output of transconductance amplifier 3 (also referred to as transconductance amplifier gm2) and also to one terminal of capacitor C1, the other terminal of which is connected to Vout conductor 25. The (+) and (−) inputs of transconductance amplifier gm2 are connected to conductors 22A and 22B, respectively.

Referring back to FIG. 4, the OUT1 output of notch filter 15 is connected by conductor 22A to the IN2(+) input of transconductance amplifier gm2 in block 3,4, and also to one terminal of a capacitor C1A, the other terminal of which is connected to ground. The output OUT2 of notch filter 15 is connected by conductor 22B to the IN2(−) input of the gm2 transconductance amplifier in block 3,4. The (+) output of feed forward transconductance amplifier 5 is connected by conductor 23A to the IN(+) input of the gm3 transconductance amplifier in block 3,4, and the (−) output of feed forward transconductance amplifier 5 is connected by conductor 23B to the IN(−) input of the gm3 transconductance amplifier in block 3,4.

In the above mentioned second chopping/notch-filtering circuit 11B, the first output OUT1 of input chopping circuit 35A is connected by means of conductor 12C to the (+) input of transconductance amplifier 2A, the (+) output of which is connected by conductor 13C to the IN1 input of output chopping circuit 40A. The output OUT2 of input chopping circuit 35A is connected by means of conductor 12D to the (−) input of transconductance amplifier 2A, the (−) output of which is connected by conductor 13D to the IN2 input of output chopping circuit 40A. The output OUT1 of output chopping circuit 40A is connected by conductor 14C to the IN1 input of notch filter 15A and to one terminal of a capacitor C5, the other terminal of which is connected to ground. The output OUT2 of output chopping circuit 40A is connected by conductor 14D to the IN2 input of notch filter 15A and to one terminal of a capacitor C6, the other terminal of which is connected to the output conductor 25 on which the output signal Vout of the dual path chopper stabilized amplifier 100 is produced. The OUT1 output and the OUT2 output of notch filter 15A are connected to conductors 22A and 22B, respectively.

Figure 1:
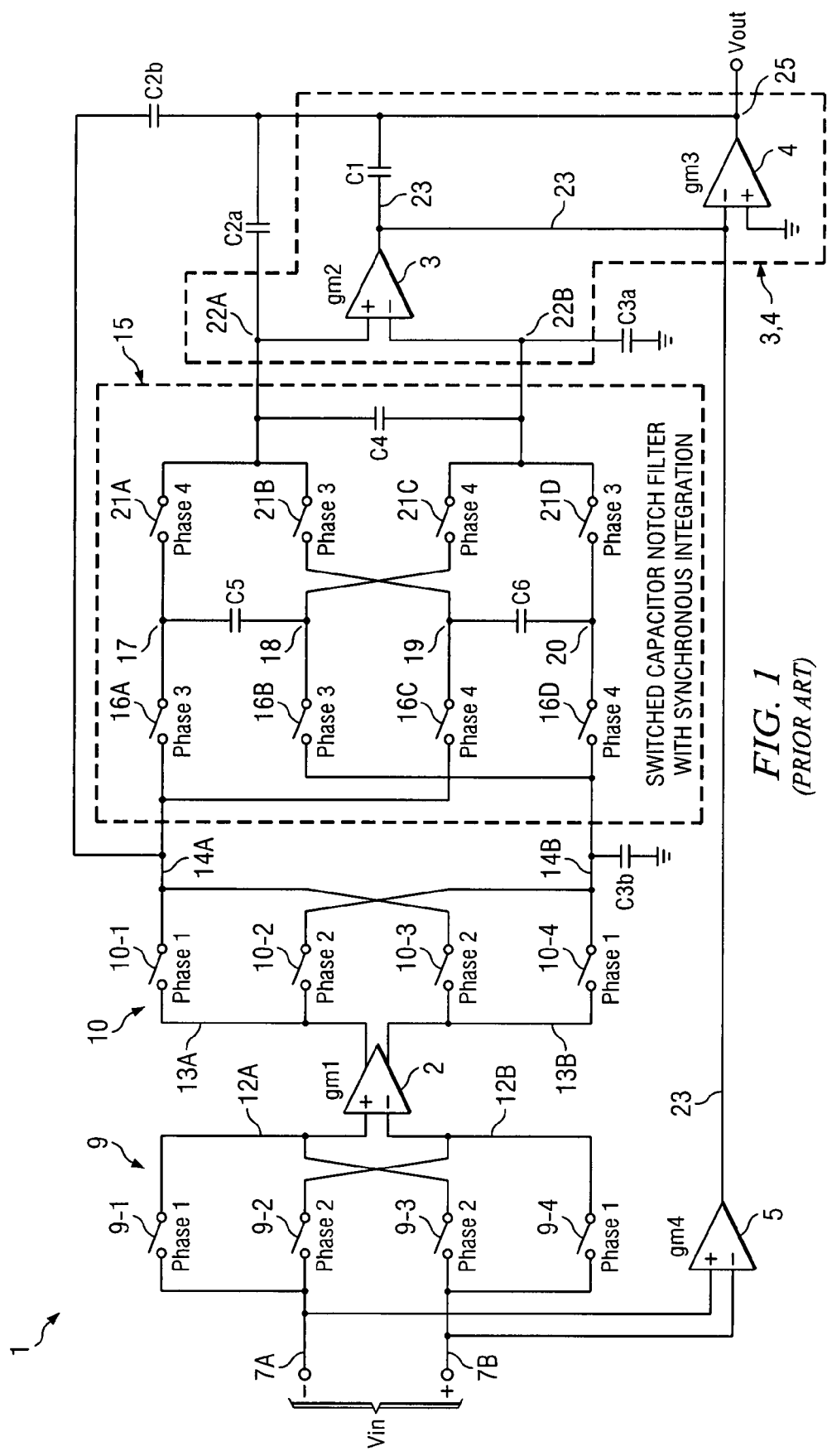
FIG. 1 is a schematic diagram of a prior art chopper stabilized amplifier which includes a notch filter to reduce ripple.

In the first chopping/notch-filtering path 11A, input chopping circuit 35 contains input chopping switches 9, which can be the same as switches 9-1,2,3,4 shown in Prior Art FIG. 1, and similarly output chopping circuit 40 contains output chopping switches 10, which can be the same as switches 10-1,2,3,4 shown in FIG. 1. Also, in the second chopping/notch-filtering path 11B, input chopping circuit 35A contains input chopping switches 9A, which can be the same as switches 9-1,2,3,4 shown in Prior Art FIG. 1, and similarly output chopping circuit 40A contains output chopping switches 10A, which can be the same as switches 10-1,2,3,4 shown in Prior Art FIG. 1. Also, notch filters 15 and 15A each contain 4 filter switches 16A-D and 4 filter switches 21A-D as shown in block 15 of Prior Art FIG. 1.

In the first chopping/notch-filtering signal path 11A, chopping clock signal CHOPCLK on conductor 43 is applied to the control (CTL) inputs (not shown) of various input chopping switches 9 as shown in Prior Art FIG. 1 and various output chopping switches 10 as shown in Prior Art FIG. 1. CHOPCLK also is applied to the input of an inverter 41 which produces the logical complement of CHOPCLK and applies it to inputs of various other input chopping switches 9 as shown in Prior Art FIG. 1 and various output chopping switches 10 as shown in Prior Art FIG. 1. Chopping switches 9 and 10 can be implemented by means of CMOS transmission gates. Similarly, filter clock signal FILTERCLK on conductor 51 is applied to CTL inputs (not shown) of various switches 16 and 21 as shown in Prior Art FIG. 1 in notch filter 15 and also is applied to the input of an inverter 41 which produces the logical complement of CHOPCLK and applies it to inputs (not shown) of various other switches 16 and 21 as shown in notch filter 1 of Prior Art FIG. 1.

However, in the above-mentioned second chopping/notch-filtering signal path 11B, the connections of CHOPCLK and FILTERCLK are reversed whereby filter clock signal FILTERCLK on conductor 51 is applied to CTL inputs of various input chopping switches 9A and various output chopping switches 10A and also is applied to the input of an inverter 52A which produces the logical complement of FILTERCLK and applies it to inputs of various other input chopping switches 9 as shown in Prior Art FIG. 1 and various output chopping switches 10 as shown in Prior Art FIG. 1. Chopping clock signal CHOPCLK on conductor 43 is applied to CTL inputs of various switches 16 and 21 as shown in Prior Art FIG. 1 in notch filter 15A and also is applied to the input of an inverter 41A which produces the logical complement of CHOPCLK and applies it to inputs of various other switches 16 and 21 as shown in notch filter 15A of Prior Art FIG. 1.

In each of the above mentioned first and second chopping/notch-filtering paths, the chopping clock is shifted 90 degrees from the filter clock so as to provide the notch filtering function in that chopping/notch-filtering path.

Figure 2A:
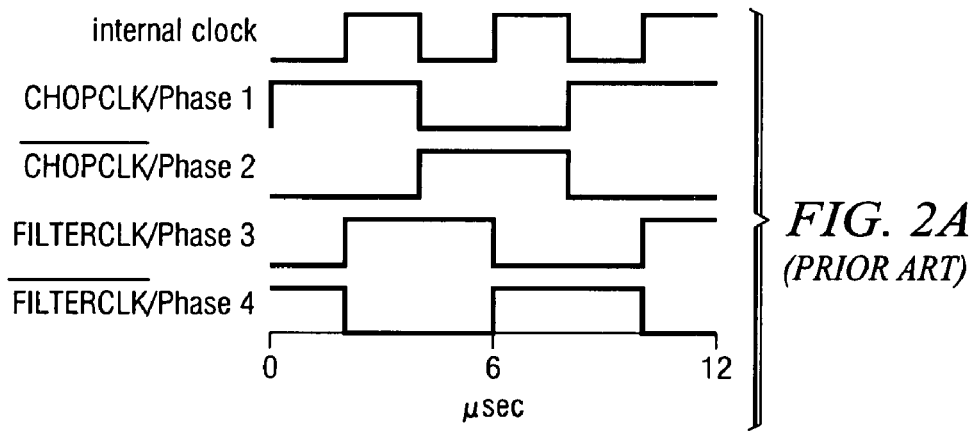
FIG. 2A and FIG. 2B are timing diagrams useful in explaining two ways of operating the chopper stabilized amplifier of FIG. 1.
Figure 2B:
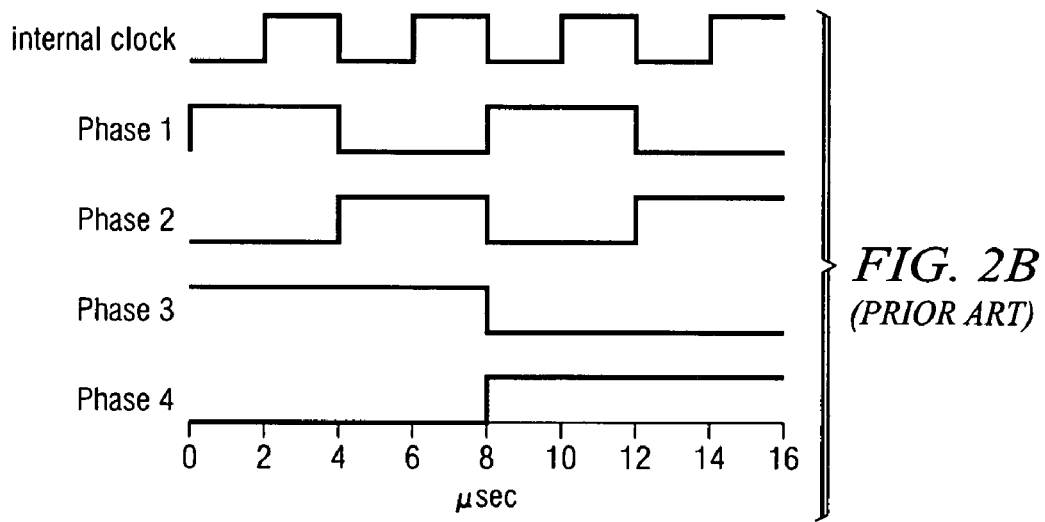

It should be noted that the timing indicated in either of FIG. 2A or 2B can be utilized in dual path chopper stabilized amplifier 100 of FIG. 4.

Satisfactory operation of chopper stabilized amplifier 1A in Prior Art FIG. 3 for a particular application usually requires that the circuitry including input chopping stage 9, transconductance amplifier 2, and output chopping stage 10 have a particular amount of transconductance Gm and that the various capacitors in notch filter 15 have particular values. For use in the same or similar application, the "net" or "composite" value of transconductance Gm of the "composite" transconductance amplifier including transconductance amplifiers 2 and 2A in FIG. 4 should have the same particular value as in Prior Art FIG. 3, and the net or composite amount of capacitance the "composite" notch filter 15,15A in FIG. 4 should have the same particular value as in Prior Art FIG. 3.

To this end, the two pairs of input and output chopping stages of the first and second chopping/notch-filtering paths in FIG. 4 can be obtained by, in effect, splitting each of the two corresponding input and output chopping stages of Prior Art FIG. 3 into two "half-sized", but otherwise essentially identical, chopping stages. The two notch filters 15 and 15A in FIG. 4 are identical to notch filter in Prior Art FIG. 3 except that each of the capacitors and switches in notch filters 15 and 15A in FIG. 4 are only approximately half the physical size of the corresponding capacitors and switches, respectively, in notch filter 15 of Prior Art FIG. 3. The Miller compensation capacitor C2 connected from output conductor 25 to conductor 14B in FIG. 4 between output chopping stage 10 and notch filter 15 is reduced by half, compared to the corresponding capacitor in FIG. 3. The same thing applies to capacitors C0 and C5 of FIG. 4, the capacitances of which are equal to one half of the capacitance of capacitor C0 in FIG. 3. Similarly, the Miller compensation capacitor C6 connected from output conductor 25 to conductor 14D between the output chopping stage 10A and the notch filter 15A also is reduced by approximately half for the circuitry in chopper stabilized amplifier 100 in FIG. 4. The input bias currents for the two pairs of chopping stages in FIG. 4 also are equal to half of the corresponding individual chopping stage input bias currents in Prior Art FIG. 3. The effective notch filter clock frequency in dual path chopper stabilized amplifier 100 in FIG. 4 is twice the notch filter clock frequency in Prior Art FIG. 3. This causes the "composite" notch filter 15,15A of FIG. 4 to have an effective update rate that is 4 times the notch filter clock frequency in Prior Art FIG. 3 even though the frequencies of CHOPCLK and FILTERCLK are unchanged. Accordingly, the delay through notch filters 15 and 15A of FIG. 4 is half the delay in notch filter 15 of Prior Art FIG. 3. (Note that the chopper stabilized amplifier 1 in Prior Art FIG. 1 operates to update capacitor C4 from integrate and transfer capacitor C5 and then from integrate and transfer capacitor C6 each cycle of the filter clock signal. Since chopper stabilized amplifier 100 of FIG. 4 updates capacitor C4 at twice the filter clock frequency of chopper stabilized amplifier 1 of FIG. 1, chopper stabilized amplifier 100 updates capacitor C4 at 4 times the filter clock frequency.)

By reducing the size of the chopping switches, the amount of charge injection associated with switching them is kept relatively constant compared to what would be required if the chopping frequency and filter clock frequency were to be increased as required by the prior art. In terms of offset and drift, the structure of the present invention operates as if the chopping frequency were reduced by a factor of two. But in terms of stability, the present invention operates as if the chopping frequency were to be doubled.

The increased effective notch filter clock frequency in dual path chopper stabilized amplifier 100 decreases the delay in notch filters 15 and 15A. Notch filters 15 and 15A can operate at the same frequency as the chopping stage, with the notch filter clock signals shifted by 90 degrees (a quarter period) relative to the chopping stage clock signal.

The present invention makes it much easier to achieve stable circuit operation of dual path chopper stabilized amplifier 100 of FIG. 4. This is a substantial advantage in systems in which the chopping clock frequency cannot be increased. The voltage glitches caused by charge injection associated with the chopping switches and the corresponding high frequency noise increases when a chopper stabilized amplifier is operating close to instability. The dual path chopper stabilized amplifier 100 in FIG. 4 reduces such residual chopping glitches and improves the noise performance.

Another advantage of the dual path chopper stabilized amplifier 100 is that the main harmonic of the glitch energy has twice the frequency of the prior art shown in FIG. 3 even though CHOPCLK and FILTERCLK in FIG. 4 have the same low frequency used in FIG. 3. Consequently, there is no degradation of the offset and offset drift performance of dual path chopper stabilized amplifier 100 as would occur if the chopper stabilized amplifier of Prior Art FIG. 3 were to be operated at twice its chopping clock and filter clock frequency in order to achieve the same improved stability, gain, and noise performance achieved by dual path chopper stabilized amplifier 100 of FIG. 4. For example, if the chopping clock and filtering clock frequency in the first above described chopping/notch-filtering path 11A is 100 kHz, then switched capacitor notch filter 15 updates the charge on C4 every 5 microseconds (i.e., updates twice per filter clock cycle); chopping clock and filtering clock for the second chopping/notch-filtering circuit 11B is shifted by 90 degrees relative to the chopping clock and filtering clock, respectively, for the first chopping/notch-filtering circuit 11A. Switched capacitor notch filter 15A also updates the charge on C4 every 5 microseconds, but shifted by 2.5 microseconds from the updating by the first chopping/notch-filtering circuit 11A. Therefore, the delay between successive updatings of the charge on capacitor C4 is reduced by a factor of 2 and the notch filter phase shift is reduced by a factor of 2. That substantially improves the stability of dual path chopper stabilized amplifier 100. Another effect of dual path chopper stabilized amplifier 100 is that transconductance stages 2 and 2A operate at half the frequency that would be required if the chopping clock frequency and notch filter clock frequency were to be doubled, as would be required by the prior art of FIG. 3. Therefore, transconductance stages 2 and 2A have enough gain to effectively suppress offset voltages referred to the output of feed forward transconductance stage 5.

Furthermore, the structure of dual path chopper stabilized amplifier 100 is achieved with no substantial increase of integrated circuit chip area, quiescent current, or chip layout design time, since the two signal chopping circuits and notch filters are identical and are half the size of the corresponding chopping signal circuits and notch filters of the prior art chopper stabilized amplifier of FIG. 3. No additional clock signal sources are required. Lower noise is achieved at the higher effective chopping frequencies, and glitch energy is shifted to higher frequencies. Low offset voltage and low offset drift performance also are achieved.

It should be appreciated that the basic idea of the present invention is to add additional parallel chopping/notch-filtering signal paths as needed to effectively increase the notch filtering frequency. For example, the embodiment of the invention shown in FIG. 4 could be implemented by adding 1, 2, 3 . . . etc. additional parallel chopping/notch-filtering signal paths, wherein the output of the resulting "composite" notch filter would be updated at a rate that corresponds to the number of additional chopping/notch-filtering signal paths, all of which have the same chopping clock and filtering clock frequency as the chopping/notch-filtering path 11A including input chopping circuit 9, output chopping circuit 10, and notch filter 15. However, the adding of more than one additional chopping/filtering signal path as in FIG. 4 makes it necessary to generate additional chopping clock and filtering clock signals with the various required phase shifts. This could be costly and impractical.

For the implementation of FIG. 4 wherein only 2 chopping/notch-filtering signal paths are used, the implementation of the present invention is essentially cost-free, because no additional clock signals are required, and very little, if any, additional integrated circuit chip area is required.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, although transconductance amplifier stages are shown in the drawings, ordinary differential amplifier stages could be used instead. Also, single ended amplifier stages could be used instead of differential amplifier stages.

What is claimed is:

1. A chopper-stabilized amplifier comprising:
   (a) a first chopping/notch-filtering circuit including
      (1) a first amplifier,
      (2) first input chopper circuitry coupled to an input of the first amplifier for chopping an input signal and applying the chopped input signal to the input of the first amplifier, and first output chopper circuitry coupled to an output of the first amplifier for chopping an output signal produced by the first amplifier, the first input chopper circuitry and the first output chopper circuitry being clocked by a first clock signal, and
      (3) a first switched capacitor notch filter having an input coupled to an output of the first output chopper circuitry and performing an integrate and transfer function on a chopped output signal produced by the first output chopper circuitry to filter a chopped output signal produced by the first output chopper circuitry by operating synchronously with a chopping frequency of the first clock signal to notch-filter noise signals on the chopped output signal of the first output chopper circuitry that otherwise would cause output ripple voltages on an output of the first switched capacitor notch filter, the first switched capacitor notch filter being clocked by a second clock signal; and
   (b) a second chopping/notch-filtering circuit including
      (1) a second amplifier,
      (2) second input chopper circuitry coupled to an input of the second amplifier for chopping the input signal and applying that chopped input signal to the input of the second amplifier, and second output chopper circuitry coupled to an output of the second amplifier for chopping an output signal produced by the second amplifier, the second input chopper circuitry and the second output chopper circuitry being clocked by a third clock signal, and
      (3) a second switched capacitor notch filter having an input coupled to an output of the second output chopper circuitry and performing an integrate and transfer function on a chopped output signal produced by the second chopper circuitry to filter a chopped output signal produced by the second output chopper circuitry by operating synchronously with a chopping frequency of the third clock signal to notch-filter noise signals on the chopped output signal of the second output chopper circuitry that otherwise would cause output ripple voltages on an output of the second switched capacitor notch filter, the second switched capacitor notch filter being clocked by a fourth clock signal; and
   (d) the outputs of the first and second switched capacitor notch filters being coupled together so as to provide a combined output signal that updates a load coupled to the outputs of the first and second switched capacitor filters at a frequency that is 4 times the frequency of the second clock signal.

2. The chopper-stabilized amplifier of claim 1 wherein the first and second amplifiers are first and second transconductance amplifiers, respectively.

3. The chopper-stabilized amplifier of claim 1 wherein the load is a capacitance.

4. The chopper-stabilized amplifier of claim 1 wherein the third clock signal is the same as the second clock signal and the fourth clock signal is the same as the first clock signal.

5. The chopper-stabilized amplifier of claim 2 wherein switching of the first switched capacitor notch filter is 90 degrees out of phase with the chopping of the output signal produced by the first transconductance amplifier, and wherein switching of the second switched capacitor notch filter is 90 degrees out of phase with the chopping of the output signal produced by the second transconductance amplifier.

6. The chopper-stabilized amplifier of claim 1 wherein the integrate and transfer functions are performed without loss of signal charge.

7. The chopper-stabilized amplifier of claim 2 including a third transconductance amplifier having an input coupled to the outputs of both of the first and second switched capacitor notch filters.

8. The chopper-stabilized amplifier of claim 1 wherein the input of the first switched capacitor notch filter includes first and second input terminals, wherein the first switched capacitor notch filter includes first and second output terminals, and wherein the first switched capacitor notch filter includes
   i. a first path including a first switch coupled between the first input terminal and a first conductor, a second switch coupled between the first conductor and the first output terminal, a third switch coupled between the second input terminal and a second conductor, and a fourth switch coupled between the second conductor and the second output terminal,
   ii. a second path including a fifth switch coupled between the first input terminal and a third conductor, a sixth switch coupled between the third conductor and the first output terminal, a seventh switch coupled between the second input terminal and a fourth conductor, and an eighth switch coupled between the fourth conductor and the second output terminal, and
   iii. a first integrate and transfer capacitor coupled between the first and second conductors and a second integrate and transfer capacitor coupled between the third and fourth conductors,
   and wherein the second switched capacitor notch filter is configured similarly to the first switched capacitor notch filter.

9. The chopper-stabilized amplifier of claim 8 wherein the first, third, sixth and eighth switches are controlled by the second clock signal and the second, fourth, fifth, and seventh switches are controlled by the fourth clock signal.

10. The chopper-stabilized amplifier of claim 9 wherein transitions of the second and fourth clock signals are shifted with respect to transitions of the first clock signal.

11. The chopper-stabilized amplifier of claim 10 wherein transitions of the second and fourth clock signals are shifted by 90 degrees with respect to transitions of a chopping signal of the first clock signal.

12. The chopper-stabilized amplifier of claim 4 wherein the first switched capacitor notch filter operates synchronously with the first chopping signal to cause a charge at the input of the first switched capacitor notch filter to be integrated onto a first integrate and transfer capacitor during the second clock signal and onto the second integrate and transfer capacitor during the fourth clock signal and to cause the charge held on the first integrate and transfer capacitor to be transferred to the output of the first switched capacitor notch filter during the fourth clock signal and to cause the charge held on the second integrate and transfer capacitor to be transferred to the output of the switched capacitor notch filter during the second clock signal, and wherein the second switched capacitor notch filter operates similarly to the first switched capacitor notch filter.

13. The chopper-stabilized amplifier of claim 1 wherein the first and second switched capacitor notch filters operate at the same or lower frequency than the chopping frequency.

14. The chopper-stabilized amplifier of claim 7 including a third transconductance amplifier having an input coupled to an output of the first and second switch capacitor notch filters, a fourth transconductance amplifier having an input coupled to receive the input signal and an output coupled to an input of a fifth transconductance amplifier.

15. A method of operating a chopper-stabilized amplifier comprising:
   (a) performing a chopping/amplifying/notch-filtering operation on an input signal in a first chopping/notch-filtering path by
      chopping the input signal in response to a first clock signal, applying the chopped input signal to the input of a first transconductance amplifier, and chopping an output signal produced by the first transconductance amplifier in response to the first clock signal to produce a first chopped output signal, and
      operating a first switched capacitor notch filter having an input coupled to receive the first chopped output signal by performing an integrate and transfer function on the first chopped output signal synchronously with the first clock signal to notch-filter noise signals in the first chopped output signal that otherwise would cause output ripple voltages of the chopper-stabilized amplifier; and
   (b) performing a chopping/amplifying/notch-filtering operation on the input signal in a second chopping/notch-filtering path by
      chopping the input signal in response to a second clock signal, applying the chopped input signal to the input of a second transconductance amplifier, and chopping an output signal produced by the second transconductance amplifier in response to the second clock signal to produce a second chopped output signal, and
      operating a second switched capacitor notch filter having an input coupled to receive the second chopped output signal by performing an integrate and transfer function on the second chopped output signal synchronously with the second clock signal to notch-filter noise signals in the second chopped output signal that otherwise would cause output ripple voltages of the chopper-stabilized amplifier; and
   (c) combining outputs of the first and second switched capacitor notch filters to provide a combined output signal that updates a load coupled to the outputs of the first and second switched capacitor notch filters at a frequency that is 4 times a frequency at which the first and second notch filters are clocked.

16. The method of claim 15 wherein switching in the first switched capacitor notch filter is 90 degrees out of phase with the chopping of the output signal produced by the first transconductance amplifier and switching in the second switch capacitor notch filter is 90° out of phase with the chopping of the output signal produced by the second transconductance amplifier.

17. The method of claim 15 wherein the first and second switched capacitor notch filters are clocked at a frequency which is the same as the frequency of the first clock signal.

18. The method of claim 15 wherein the first and second switched capacitor notch filters are clocked at a frequency which is less than the frequency of the first clock signal.

19. The method of claim 16 including performing the integrate and transfer functions without loss of signal charge.

20. A chopper-stabilized amplifier comprising:
   (a) means for performing a chopping/amplifying/notch-filtering operation on an input signal in a first chopping/notch-filtering path, including
      means for chopping the input signal in response to a first clock signal and applying the chopped input signal to the input of a first transconductance amplifier, and means for chopping an output signal produced by the first transconductance amplifier in response to the first clock signal to produce a first chopped output signal, and
      means for operating a first switched capacitor notch filter having an input coupled to receive the first chopped output signal by performing an integrate and transfer function on the first chopped output signal synchronously with the first clock signal to notch-filter noise signals in the first chopped output signal that otherwise would cause output ripple voltages of the chopper-stabilized amplifier; and
   (b) means for performing a chopping/amplifying/notch-filtering operation on the input signal in a second chopping/notch-filtering path, including
      means for chopping the input signal in response to a second clock signal and applying the chopped input signal to the input of a second transconductance amplifier, and means for chopping an output signal produced by the second transconductance amplifier in response to the second clock signal to produce a second chopped output signal, and
      means for operating a second switched capacitor notch filter having an input coupled to receive the second chopped output signal by performing an integrate and transfer function on the second chopped output signal synchronously with the second clock signal to notch-filter noise signals in the second chopped output signal that otherwise would cause output ripple voltages of the chopper-stabilized amplifier; and
   (c) means for combining outputs of the first and second switched capacitor notch filters to provide a combined output signal that updates a capacitance coupled to the outputs of the first and second switched capacitor notch filters at a frequency that is 4 times a frequency at which the first and second notch filters are clocked.

* * * * *